(12) United States Patent
Chen et al.

(10) Patent No.: US 7,009,124 B2
(45) Date of Patent: Mar. 7, 2006

(54) ACCELERATION SWITCH

(75) Inventors: Shiuh-Hui Steven Chen, Lake Zurich, IL (US); Jen-Huang Albert Chiou, Libertyville, IL (US); Carl A. Ross, Mundelein, IL (US)

(73) Assignee: Motorola, Inc., Schaumburg, IL (US)

( * ) Notice: Subject to any disclaimer, the term of this patent is extended or adjusted under 35 U.S.C. 154(b) by 130 days.

(21) Appl. No.: 10/845,381

(22) Filed: May 13, 2004

(65) Prior Publication Data
US 2005/0252755 A1 Nov. 17, 2005

(51) Int. Cl.
*H01H 35/02* (2006.01)

(52) U.S. Cl. .................. 200/61.45 R; 200/61.45 M

(58) Field of Classification Search ......... 200/61.45 R, 200/61.45 M, 61.48, 61.49, 61.53, 61.5; 73/514.17, 514.18, 514.38, 514.01, 514.16, 73/514.21, 514.36
See application file for complete search history.

(56) References Cited

U.S. PATENT DOCUMENTS

| | | | | |
|---|---|---|---|---|
| 4,855,544 A | * | 8/1989 | Glenn | 200/61.45 R |
| 5,365,790 A | | 11/1994 | Chen et al. | |
| 5,637,904 A | | 6/1997 | Zettler | |
| 5,828,138 A | * | 10/1998 | McIver et al. | 307/10.1 |
| 5,894,144 A | * | 4/1999 | Mori et al. | 257/254 |
| 5,905,241 A | * | 5/1999 | Park et al. | 200/409 |
| 5,962,789 A | * | 10/1999 | Matsunaga et al. | 73/514.38 |
| 5,990,427 A | * | 11/1999 | Lammert et al. | 200/61.53 |
| 6,072,247 A | * | 6/2000 | Lammert et al. | 307/10.1 |
| 6,336,658 B1 | * | 1/2002 | Itoigawa et al. | 280/735 |
| 6,619,123 B1 | | 9/2003 | Gianchandani et al. | |
| 6,797,899 B1 | * | 9/2004 | Itoigawa et al. | 200/61.48 |

FOREIGN PATENT DOCUMENTS

JP    1068742    * 10/1998

OTHER PUBLICATIONS

Comello, Vic: Transistor Design Advances Drive SOI into the Mainstream, R & D Semiconductor Research, R&D Magazine, Jul. 1999, www.rdmag.com, pp. 20-22.

* cited by examiner

*Primary Examiner*—Lisa Klaus
(74) *Attorney, Agent, or Firm*—Brian M. Mancini; Thomas V. Miller

(57) ABSTRACT

An acceleration switch and method therefor includes providing a conductive substrate and an insulating cap. A recessed area is formed in the insulating cap. An insulating layer is disposed on the conductive substrate. A conductive layer is disposed on the insulating layer. The conductive layer is etched to form a cantilever beam and an electrically isolated island. The insulating layer is etched around the cantilever beam to free the cantilever beam to move. Contacts are disposed on the cantilever beam and in the recessed area such that the contacts are able to electrically contact each other upon application of an acceleration to the switch. The cap is bonded to the conductive layer to hermetically seal the cantilever beam.

6 Claims, 3 Drawing Sheets

ACCELERATION SWITCH

FIELD OF THE INVENTION

This invention is generally directed to electrical switches, and in particular to integrated acceleration switches.

BACKGROUND OF THE INVENTION

Devices having bonded conductive and insulating substrates are fabricated with many different materials. A combination of metal, glass, and semiconductor materials are often used to create these devices and their packages. These materials are fused into a structure by many different processes as are known in the art. Some of these devices require a sealed chamber with a device therein and electrical connections to outside the package. Devices that typically have a requirement for this type of structure include all types of miniaturized switches or sensors, such as a pressure sensor for Tire Pressure Monitoring Systems (TPMS) for example. Considering the micromachined variety of switches and sensors, one feature many of these devices have in common is complex structures that must be contained in separate hermetic packaging, which can be difficult to manufacture and expensive to produce. In addition to packaging issues, there are operational issues.

Federal regulations are involved with Tire Pressure Monitoring Systems (TPMS). Therefore, reliability is an issue. In addition, Original Equipment Manufacturers (OEMs) have their own specifications for operation of TPMS. For example, having a tire pressure sensor in each tire of a vehicle that communicates to the vehicle over radio frequencies can cause confusion in situations where vehicles are in close proximity to each other such as parking lots. Further, tire pressure monitors are typically battery powered. Therefore, OEMs want a TPMS that only operates at particular time, so as to not crowd the airwaves and save battery power.

One solution is to provide a pressure sensor in a tire that includes an RF transmitter an RF receiver. The RF receiver of the sensor is used by the vehicle to tell the TMPS when to turn on and operate. However, the added RF receiver adds cost, and the sensor must periodically power the receiver to determine if a signal is being sent by the vehicle. Therefore, additional logic and clocking is required to provide this function. As a result, this solution adds costly circuitry and does not provide optimal battery usage.

Accordingly, there is a need for a tire pressure monitor system that is only operational when needed. It would also be of benefit, if the system could be provided in a simple assembly at a low cost and with a high reliability.

BRIEF DESCRIPTION OF THE DRAWINGS

The features of the present invention, which are believed to be novel, are set forth with particularity in the appended claims. The invention, together with further objects and advantages thereof, may best be understood by making reference to the following description, taken in conjunction with the accompanying drawings, in the several figures of which like reference numerals identify identical elements, wherein:

FIG. 1 is a cross-sectional view of a substrate, insulator, and conductive layer assembly along with a cap, in accordance with the present invention;

FIG. 2 is a cross-sectional view of FIG. 1 with the addition of electrodes and etching of the conductive layer, in accordance with the present invention;

FIG. 3 is a top view of the assembly of FIG. 2, in accordance with the invention;

FIG. 4 is a cross-sectional view of FIG. 2 with metallization of the cap and etching of the insulator layer wherein the beam and diaphragm are defined, in accordance with the invention;

FIG. 5 is a cross-sectional view of the final assembly of FIG. 4, in accordance with the invention;

DETAILED DESCRIPTION OF THE PREFERRED EMBODIMENT

The present invention is an acceleration switch and method therefor for a fire pressure monitor system (TPMS). A capacitive pressure sensor is integrated in the same packaging as the switch, and the packaging process is used to simultaneously produce the switch and sensor. The switch serves to turn on the sensor and associated electronics only when the operation of the TPMS is needed (i.e. the vehicle is moving). In practice, the switch is mounted on the vehicle tire and the centrifugal force of the spinning wheel activates the switch which is connected to a power source to turn on the sensor electronics and a RF transmitter, which transmit tire pressure information to the vehicle. The system is provided in a simple assembly at a low cost and with a high reliability.

Figure 3:
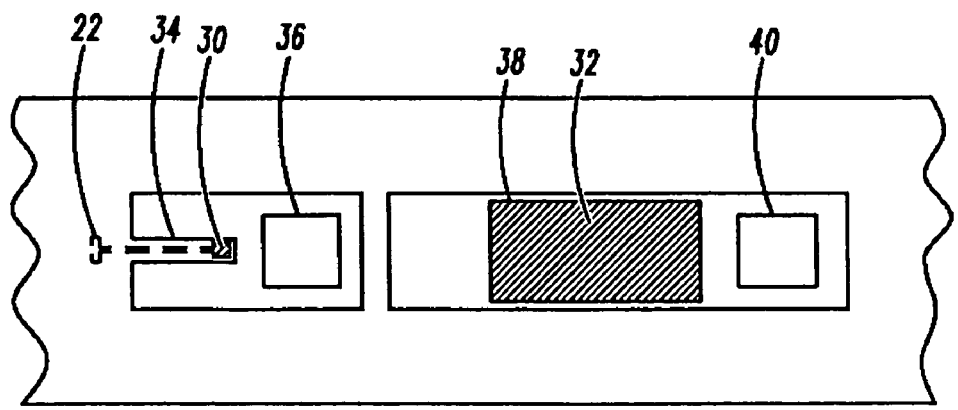
Figure 4:
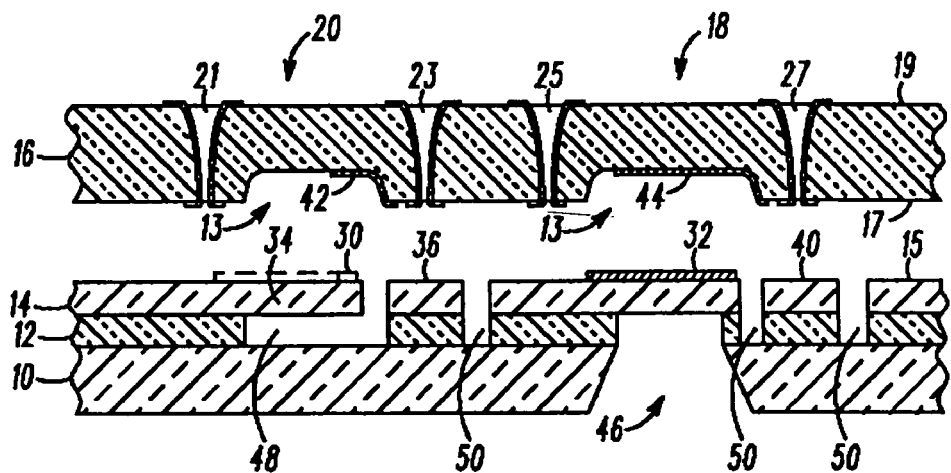
Figure 5:
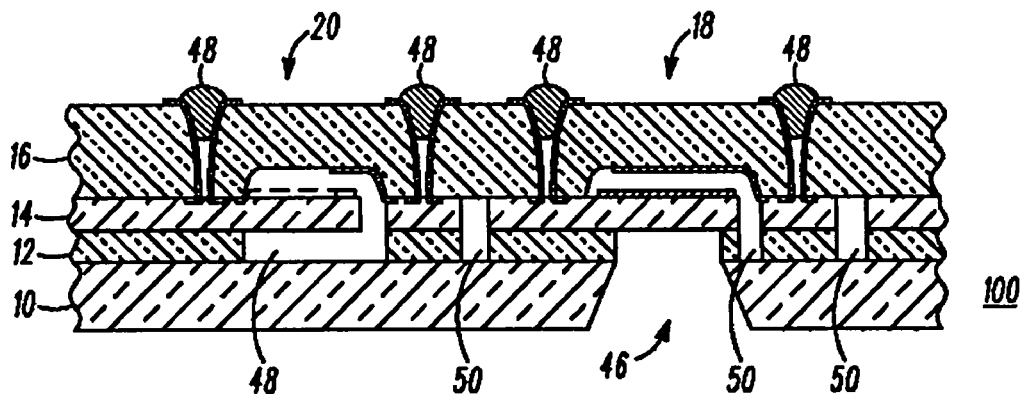
Figure 6:
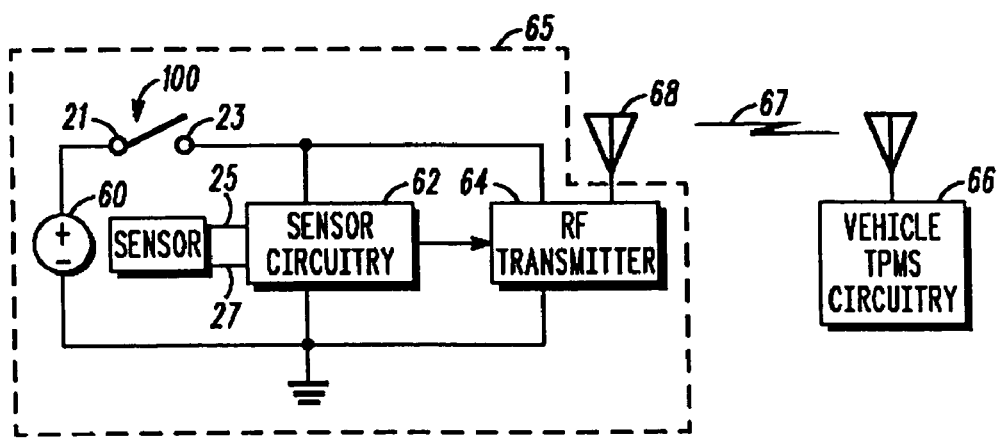
FIG. 6 is a schematic diagram of a circuit utilizing the present invention.

In FIGS. 1–5 a method is illustrated to teach a fabrication process to make an acceleration switch and capacitive pressure sensor in an integrated hermetic package. The present invention overcomes the deficiencies of the prior art because the devices are produced at the same time as the packaging for those same devices. The apparatus resulting from the application of the present method is shown in FIG. 5 and is used with further electronics (as shown in FIG. 6) coupled to the sensor and in the vehicle as part of a TPMS.

Figure 1:
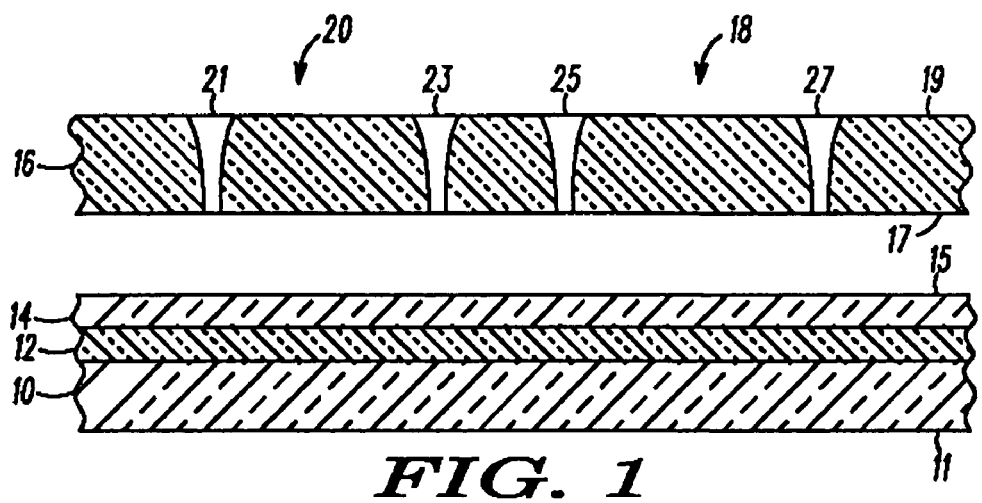
FIGS. 1–5 are cross-sectional views illustrating various process steps for providing an acceleration switch, in accordance with the present invention.

Referring to FIG. 1, a silicon substrate 10 is provided with a top surface 15 and a bottom surface 11. This silicon substrate 10 is only used as a support. Other conductive or insulating substrates, can also be used equally well for this function. An electrically insulating layer 12, in this case an oxide, such as a silicon dioxide layer, is disposed on the top surface of the silicon substrate 10. The insulating layer is much thinner (e.g. one to ten microns) than the silicon substrate 10 but is shown much thicker here for easier viewing. An electrically conductive (e.g. polysilicon) layer 14 is disposed on a top surface of the insulating layer 12. Preferably, the conductive layer is heavily-doped, p+ or n+ single-crystalline silicon to provide a bulk resistance of about 0.02 ohm-centimeters. However, a polycrystalline material can be used. The conductive layer is much thinner (e.g. one to ten microns) than the silicon substrate 10 but is shown much thicker here for easier viewing.

The disposing of the layers can be performed using any of the available techniques to construct such assemblies. Preferably, a silicon-on-insulator (SOI) configured wafer is used, as are known in the art. For example, a SOI wafer can be constructed using a substrate followed by a chemical vapor deposition process to dispose a silicon dioxide layer and later to dispose a polysilicon layer. Various types of chemical vapor deposition known in the art, including high pressure deposition, can be used in fabricating an acceleration switch and capacitive pressure sensor in accordance with the present invention.

FIG. 1 also shows an insulating cap 16. The cap 16 is essentially a planar glass substrate and has a top surface 19 and an opposing bottom surface 17. A plurality of feedthroughs 21, 23, 25, 27 extend between the top and bottom surfaces 19, 17 of the cap 16. Preferably, the feedthroughs are laser-drilled. However, various techniques known in the art to make vias in glass can be used. In this description and subsequent discussion, the components of the substrate 10, insulating layer 12, conductive layer 14, and cap have respective first portions 18 and second portions 20. The first portion 18 is developed as a capacitive pressure sensor, and the second portion 20 is developed as an acceleration switch.

Figure 2:
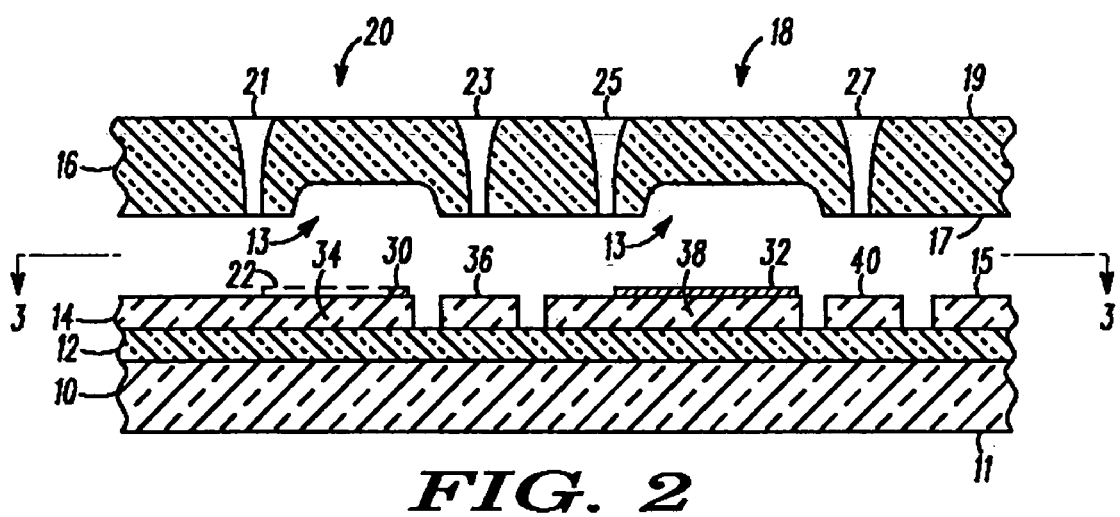

Referring to FIGS. 2 and 3, metal 30, 32 is disposed on a top surface 15 of the conductive layer 14. One metal contact 30 is for the acceleration switch, and a metal electrode 32 is for the capacitive pressure sensor. The metals can be disposed using many known methods. In the preferred embodiment, a sputtering process is used. Preferably, the metal is gold with a diffusion barrier metal (e.g. chromium, titanium/platinum, chromium/nickel vanadium, etc.) as are variously known in the art. Although aluminum could be used, it is desirable to use gold to deter corrosion for improved reliability. The metal can be deposited and patterned using many different techniques for masking/photoresist and deposition, as are known in the art. The electrical connection to the switch contact 30 is through the conductive layer 14. Optionally, additional metal 22 can be used to alter the electrical resistance of the connection.

The conductive layer is patterned and (isotropically) etched as shown in the construction of a diaphragm 38 (which is later completed by a back-side etch 46 of FIG. 5) and electrically isolated island 40 in a first portion 18 and a cantilever beam 34 and electrical isolation island 36 in a second portion 20. The cantilever beam is configured with a width of about ten microns or less, and preferably has a thickness of about five microns. Of course, the exact dimensions can be modified to provide the needed deflection of the cantilever beam at a particular acceleration. However, the width of the beam should be limited to provide sufficient ability of the insulating layer etchant to fully undercut the beam. Alternatively, holes (not shown) can be provided in the beam itself to better facilitate the insulating layer etchant to fully undercut the beam. The patterning process used in this embodiment is a photolithographic process of applying photoresist, exposing and developing the photoresist, wet or dry etching the surface on which the photoresist was applied, and then removing the photoresist. This process is commonly known to those of ordinary skill in the art.

The insulating cap 16 is patterned and etched on a bottom surface 17 as shown to define a recess 14 in the first portion 18 and another recess 13 in the second section 20. The patterning process used in this embodiment is a photolithographic process of applying photoresist, exposing and developing the photoresist, wet etching the surface on which the photoresist was applied, and then removing the photoresist. This process is commonly known to those of ordinary skill in the art, and typically uses a hydrofluoric or buffered hydrofluoric wet etch process. Although two recesses are shown it should be recognized that only one recess can also be used if both isolated island portions 36, 40 are moved to near the left and right edges of the package. In this way, the isolated islands are moved out from under the recess to allow an electrical connection through a cap feedthrough.

Referring to FIG. 4, insulating layer 12 is (isotropically) etched to undercut 48 the cantilever beam 34 and free the beam to deflect upon an acceleration. The etching process uses a hydrofluoric or buffered hydrofluoric wet etch process. It should be noted that during the processing of the insulating layer 12 isolation trenches 50 are extended around the islands 36, 40. This is the result of choosing an efficient process and is not actually required because the isolation trenches 50 in the conductive layer 14 (as shown in FIG. 2) are sufficient to isolate the islands 36, 40. Otherwise, protecting these areas would then require a further photoresist step. However, the extension of the isolation trench 50 through the insulating layer 12 with the lower isolation trench 50 doesn't adversely effect the operation of the present invention.

The substrate 10 is patterned and anisotropically etched in the first portion 18 to open an aperture 46 for the pressure sensor. The patterning process used is a photolithographic process of applying photoresist, exposing and developing the photoresist, wet or dry etching the surface on which the photoresist was applied, and then removing the photoresist. This process is commonly known to those of ordinary skill in the art. Preferably, the insulating layer 12 is further etched in the aperture to provide more compliance for the pressure sensor diaphragm.

The glass cap 16 is further processed by disposing a metal layer on both the top surface 19 and bottom surface 17 of the cap 16 as well as coating the feedthroughs 21, 23, 25, 27. For the acceleration switch and capacitive pressure sensor being constructed, successive layers of chromium, nickel-vanadium and gold are used for the metallization. Of course, other metals can be used.

The glass cap 16 is then patterned and etched to remove the excess metal layer on the top surface 19 and the opposing bottom surface 17. At this stage, electrical connections have been provided through the feedthroughs. Preferably, the electrical connections extend beyond each top and bottom orifice of the feedthroughs to form a shoulder to better facilitate an electrical connection after assembly. In addition, a top electrode 44 is provided that extends within the first portion recess 14 for the pressure sensor to complement the bottom electrode 32 that was deposited on the conductive layer. Similarly, a top contact 42 is provided that extends within the second portion recess 13 for the acceleration switch in the second portion 20 to complement the bottom contact 30 that was deposited on the conductive layer. As shown, the contact and electrode 42, 44 do not directly connect to their associated feedthroughs 23, 27, although they could be configured in this manner. Instead, the electrical connection therebetween is completed by the respective electrical conductive layers 36, 40 after assembly thereto. This is done to provide some control of the resistance of these connections, using the doping of the conductive layer 14.

FIG. 5 shows the glass cap 16 bonded to the remaining assembly 10, 12, 14. The bottom surface 17 of the glass cap can be bonded anodically or electrostatically to the top surface 15 of the conductive layer 14. Preferably, anodic bonding is used wherein a positive bias is applied to the conductive layer and a negative bias is applied to the glass layer. Anodic bonding is known in the art, and need not be explained here within the exception of noting that the anodic bonding causes a diffusion of the lower shoulders of the feedthroughs 21, 23, 25, 27 into the conductive layer 14 to form a gold-silicon eutectic bond. The anodic bonding can be performed in an inert atmosphere or in a vacuum. The fusing of the layers causes the recesses 13, 14 to form a hermetically sealed chamber for the acceleration switch and for one side of the pressure sensor. The other side of the diaphragm of the pressure sensor is exposed to the environment for pressure measurement.

To aid in providing an external, surface mountable, electrical connection, a solder ball 48 is melted into each of the feedthroughs 21, 23, 25, 27 to complete the acceleration switch 100 with integrated pressure sensor. There is no need to rely on the solder to provide a seal in the feedthroughs. Therefore, if any microcracks appear in the solder in the feedthroughs or in the glass cap, they are inconsequential to the sealing of the recesses.

Referring to FIGS. 5 and 6, as assembled, the cantilever beam 34 of the acceleration switch is able to upwardly deflect, upon sufficient acceleration, for lower contact 30 to touch upper contact 42, thereby completing a connection between feedthroughs 21 and 23. The upper and lower electrodes 44, 32 of the pressure sensor define capacitive plates, wherein a pressure applied at the aperture 46 serves to deflect the diaphragm 38 to change the capacitance therebetween.

The switch is connected to a battery 60 to power the portion of the TPMS that is mounted in a vehicle's tire, for example. The battery 60 powers a pressure sensor circuit 62 and an RF transmitter 64. The pressure sensor is coupled with the sensor circuitry 62 through feedthroughs 25 and 27. The sensor circuitry 62 detects the capacitance of the pressure sensor and supplies a signal to the RF transmitter indicative of tire pressure. The RF transmitter relays this information to the vehicle TPMS circuitry for use by a driver.

In a preferred embodiment, the switch and sensor 100, battery 60, sensor circuitry 64, and RF transmitter 64 are co-located in a module 65 in each vehicle tire. For example, these circuits can be combined within an air input valve of the tire, with the metal valve stem of the valve serving as the antenna 68. The signal 67 sent by the module 67 is coded to include an identifier of which tire is signaling and an indication of that tire's pressure. In practice, the switch is configured to provide power to the module 65 only when the vehicle exceeds a certain speed (e.g. 30 miles/hour).

Figure 7:
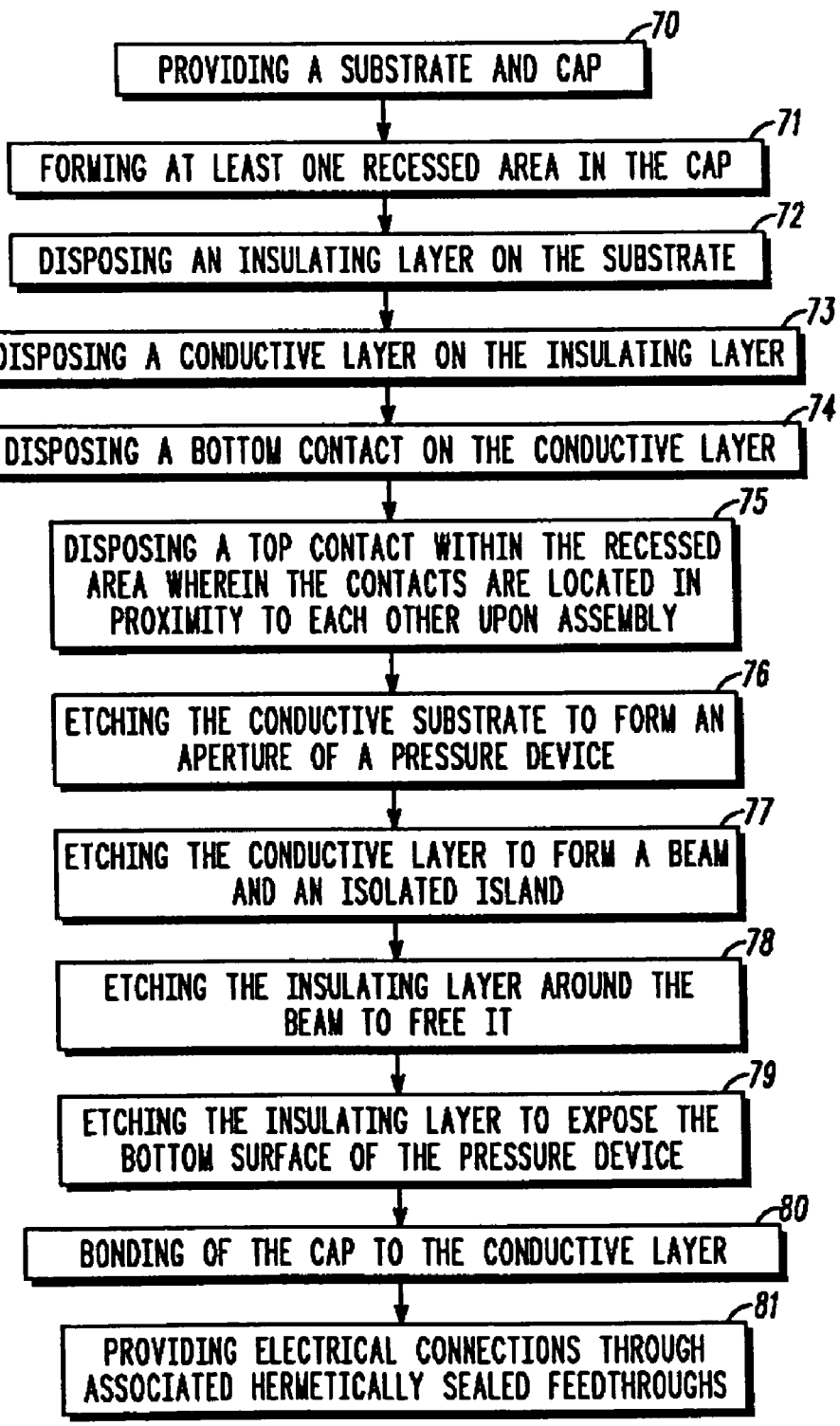
FIG. 7 is a flow chart of a method, in accordance with the present invention.

Referring to FIG. 7, the present invention also incorporates a method for fabricating an acceleration switch with integrated pressure sensor. A first step 70 includes providing a conductive substrate and an insulating cap. A next step 71 includes forming at least one recessed area in the insulating cap. A next step 72 includes disposing an electrically insulating layer on the conductive substrate. A next step 73 includes disposing a conductive layer on the insulating layer, the cap, substrate, insulating, and conductive layers having associated first and second portions.

A next step 74 includes disposing a conductive metal on a top surface of the conductive layer to form a bottom switch electrode in the first portion and a bottom sensor electrode in the second portion. A next step 75 includes disposing a conductive metal within the at least one recessed area of the cap to form a top switch electrode in the second portion and a top sensor electrode in the first portion, wherein the respective top and bottom electrodes of the switch and sensor are located in proximity to each other upon assembly of the integrated accelerator switch with pressure sensor.

A next step 76 includes etching the conductive substrate anisotropically to expose a bottom surface of the insulating layer in the first portion. A next step 77 includes etching the conductive layer isotropically to form a pressure diaphragm and an electrically isolated island in a first portion and a cantilever beam and electrically isolated island in a second portion. A next step 78 includes etching the insulating layer around the cantilever beam in the second portion to free the cantilever beam to deflect during an acceleration, and etching 79 the insulating layer through the first portion to expose the bottom surface of the pressure diaphragm of the conductive layer.

A next step 80 includes anodic bonding of the cap to the conductive layer in a substantial vacuum to hermetically seal the integrated acceleration switch with pressure sensor, wherein the top and bottom switch electrodes define an acceleration switch and the top and bottom sensor electrodes define a capacitive pressure sensor.

A preferred embodiment further comprises a step 81 of providing electrical connections to each electrode through associated hermetically sealed feedthroughs. In particular, this step includes the substeps of opening feedthrough apertures through the electrically insulating cap to the conductive layer such that one aperture abuts the isolated island after the affixing step, and disposing metalization through the feedthrough apertures such that the metalization contacts the conductive layer after the affixing step. This can further include filling the feedthroughs with solder. Of course, persons of ordinary skill in the art will realize that the precise sequence of each step of this process may not be critical and other sequences could also be used to form this structure.

The present invention advantageously provides an acceleration switch with integrated pressure sensor that are produced simultaneously with their associated packaging. The resulting device provides a solution to the problem of providing a low-cost and efficient tire pressure monitoring system. The geometries of the constituent elements, including the substrate, the insulating layer, the conductive layer, the glass cap and the various patterns as illustrated herein, are suitable for an acceleration switch and a capacitive pressure sensor. Of course, other geometries may also be used to take advantage of the inventive process described. Although this embodiment details the construction and packaging of an acceleration switch and a capacitive pressure sensor, this invention can have other application to devices produced simultaneously with their packaging and where insulated electrical contacts are required.

While the present invention has been particularly shown and described with reference to particular embodiments thereof, it will be understood by those skilled in the art that various changes may be made and equivalents substituted for elements thereof without departing from the broad scope of the invention. In addition, many modifications may be made to adapt a particular situation or material to the teachings of the invention without departing from the essential scope thereof. Therefore, it is intended that the invention not be limited to the particular embodiments disclosed herein, but that the invention will include all embodiments falling within the scope of the appended claims.

What is claimed is:

1. An acceleration switch comprising:
   a substrate;
   a conductive layer disposed on the insulating layer, the conductive layer having a cantilever beam and an electrically isolated island formed therein;
   an electrically insulating layer disposed between the substrate and the conductive layer, the insulating layer having a recess next to the cantilever beam to allow the cantilever beam to deflect upon an acceleration;
   an insulating cap with a recessed area formed on a bottom surface thereof, the cap affixed to the conductive layer to form a hermetically sealed chamber therebetween to contain the cantilever beam and allow the cantilever beam to deflect upon an acceleration; and a first contact disposed on the cantilever beam and a second contact disposed in the recessed area of the insulating cap such that the contacts are in proximity to each other and able to electrically contact each other upon application of an acceleration to the switch.

2. The switch of claim 1, further comprising electrical connections to each contact and electrode through associated feedthroughs.

3. The switch of claim 2, wherein the feedthroughs are located between a top and bottom surface of the cap and are metalized therethrough to contact the conductive layer to couple to the contacts and electrodes.

4. The switch of claim 2, further comprising solder that fills the feedthroughs.

5. The switch of claim 2, wherein the conductive layer is isotropically etched.

6. The switch of claim 2, wherein the cap is anodic bonded to the conductive layer and the chamber is in substantially a vacuum.

* * * * *